USO05468996A

United States Patent [19]

Chan et al.

[11] Patent Number: 5,468,996
[45] Date of Patent: Nov. 21, 1995

[54] ELECTRONIC PACKAGE ASSEMBLY AND CONNECTOR FOR USE THEREWITH

[75] Inventors: Benson Chan, Vestal; Fletcher L. Chapin, Maine; Vincent M. Fiacco; John R. Mankus, both of Endicott; Robert S. Pokrzywa, Binghamton, all of N.Y.

[73] Assignee: International Business Machines Corporation, Armonk, N.Y.

[21] Appl. No.: 218,002

[22] Filed: Mar. 25, 1994

[51] Int. Cl.[6] .................................................. H01L 23/34
[52] U.S. Cl. .................... 257/723; 257/724; 257/726; 257/727
[58] Field of Search .................................. 257/724, 726, 257/723, 725, 727

[56]  References Cited

U.S. PATENT DOCUMENTS

| 31,114 | 12/1882 | Berg | 339/17 |
|---|---|---|---|
| 3,239,916 | 3/1966 | Love | 29/155.5 |
| 3,629,787 | 12/1971 | Wilson | 174/88 R |
| 4,554,505 | 11/1985 | Zachry | 324/158 |
| 4,830,623 | 5/1989 | Owens et al. | 439/71 |
| 4,878,846 | 11/1989 | Schroeder | 439/65 |
| 4,902,234 | 2/1990 | Brodsky et al. | 439/67 |
| 4,980,635 | 12/1990 | Walton et al. | 324/158 |
| 5,018,005 | 5/1991 | Lin et al. | 357/80 |
| 5,059,129 | 10/1991 | Brodsky et al. | 439/67 |
| 5,176,524 | 1/1993 | Mizuno et al. | 439/68 |
| 5,186,632 | 2/1993 | Horton et al. | 439/67 |
| 5,273,440 | 12/1993 | Ashman et al. | 439/71 |
| 5,304,843 | 4/1994 | Takubo et al. | 257/787 |

FOREIGN PATENT DOCUMENTS 2169154   7/1986   United Kingdom .

OTHER PUBLICATIONS

IBM TDB, vol. 35, No. 7, Dec. 1992, "Double-Capped Package for a Multichip Thin-Film Module", S. L. Buchwalter et al., pp. 485–486.
IBM Technical Disclosure Bulletin (TDB), vol. 13, No. 6, Nov. 1970, "High Density Circuits Connector", S. M. Jensen et al., pp. 1529–1530.
IBM TDB, vol. 28, No. 7, Dec. 1985, "Flexible Module Carrier Direct Connection Package", pp. 2855–2856.

Primary Examiner—William Mintel
Assistant Examiner—Roy Potter
Attorney, Agent, or Firm—Lawrence R. Fraley

[57]  ABSTRACT

An electronic package including a base member and associated cover member designed for being positioned together to compress at least two circuitized substrates (e.g., a ceramic substrate and a plurality of flexible substrates) positioned therein. One of the substrates is substantially rigid and is positively positioned in a protected, aligned manner within the base. Additionally, the flexible substrates are precisely aligned and initially secured to the rigid substrate, the invention further using yet another resilient means to act against each of the flexible substrates when the packages are fully assembled. The cover is secured to the base to effect final compression of the internal elements. This package may be positioned on and electrically coupled to another circuitized substrate, e.g., PCB.

7 Claims, 4 Drawing Sheets

ELECTRONIC PACKAGE ASSEMBLY AND CONNECTOR FOR USE THEREWITH

TECHNICAL FIELD

The invention relates to electronic package assemblies and particularly to such assemblies wherein at least two separate circuitized substrates are electrically connected. Even more particularly, the invention relates to such assemblies wherein external pressure is applied to one or both of the circuitized substrates (e.g., flexible circuit) to effect the connection.

BACKGROUND OF THE INVENTION

Utilization of electronic package assemblies for the purpose of electrically coupling various circuit devices is, of course, well known, with various examples being shown and described in the following patents:

U.S. Pat. No. 4,830,623—M. J. Owens
U.S. Pat. No. 5,059,129—W. L. Brodsky et al.
U.S. Pat. No. 5,176,524—H. Mizuno In the design of electronic package assemblies wherein direct contact is desired between the individual electrical conductors (e.g., printed circuit lines, contact pads, etc.) which constitute part of the circuit devices being coupled, precise alignment between the conductors as well as application of a reliable contact pressure of sufficient duration and capable of withstanding possible adverse environmental conditions (e.g., heat, moisture) are considered essential. Clearly, alignment, particularly when involving high density, extremely small conductors, is deemed critical to effective package assembly and operation. Concerning force application, it is also known that excessive pressure can result in damage to various components of the assembly (particularly the conductors) during both assembly and/or operation. Additionally, the provision of such pressure has heretofore typically been accomplished through the utilization of relatively large and complex components (e.g., connector housings) needed to produce these assemblies, thus also adding unnecessarily to the cost thereof. In those assemblies subjected to adverse environmental conditions such as mentioned above, failure to withstand same has also resulted in such problems as contact corrosion, reduced contact pressure, increased maintenance costs, etc.

In U.S. Pat. No. 4,902,234 (W. L. Brodsky et al.), assigned to the same assignee as the instant invention, there is defined a connector assembly wherein an elastomeric pressure exertion member is utilized to provide reliable contact pressure against at least one of the circuit members (e.g., a flexible circuit). This exertion member includes a base plate, a plurality of individual compressible elements located on one side of the plate, and a resilient member located on the plate's other side. As understood from the following, some of the advantageous teachings of this patent may be successfully utilized in the present invention. The disclosure of U.S. Pat. No. 4,902,234 is thus incorporated herein by reference.

One example of an electronic package to which the teachings herein particularly apply is often referred to in the art as a multichip module (MCM) wherein several semiconductor devices (chips) are used in combination with a common substrate (e.g., ceramic). The chips are typically positioned on the substrate's upper surface and electrically coupled, including possibly to one another, to associated circuitry also typically located on the same surface. One technique developed by the assignee of the present invention for this purpose is a solder process known as controlled collapse chip connection (C4).

Understandably, the growing demand for increased miniaturization of such packages necessitates an effective means for electrically coupling the package to various external circuits (e.g., on a larger substrate such as a printed circuit board on which the package is positioned), while also assuring effective positioning thereof within a suitable, protective housing.

As will be defined hereinbelow, the electronic package assembly of the present invention defines a miniaturized compact package structure that uniquely provides effective, reliable contact pressure of relatively low magnitude between the two circuitized substrates therein through the utilization of effective materials which are relatively inexpensive and which can withstand adverse environmental conditions such as excessive heat and moisture, while also assuring effective, aligned positioning of the substrates and the various components (e.g., chips) thereof. It is believed that such an electronic package, including a connector assembly for use therewith, would constitute a significant advancement in the art.

DISCLOSURE OF THE INVENTION

It is a primary object of the invention to enhance the art of electronic package assemblies.

It is another object of the invention to provide an electrical connector assembly for use with such a package wherein the connector provides sound, effective contact pressure in a reliable manner.

It is yet another object of the invention to provide such an electronic package and connector assembly which are operable in relatively adverse environmental conditions such as high heat and moisture.

It is a still further object of the invention to provide an electronic package assembly and also an electrical connector assembly possessing, among others, the several features described herein and yet which can be produced on a relatively large scale (e.g., mass production), thus reducing the overall cost thereof in comparison to many known assemblies of the prior art.

These and other objects are achieved according to one aspect of the invention through the provision of an electronic package assembly comprising a base member defining a receiving area therein, the base member including first and second resilient means as part thereof. A substantially rigid circuitized substrate is positioned within the receiving area of the base member, the rigid substrate being located on the first resilient means while the second resilient means assists in positioning the rigid substrate in predetermined alignment within the receiving area. The rigid substrate includes a first surface having a first plurality of contact pads located thereon and at least one (and preferably several) semiconductor device positioned on the substantially rigid circuitized substrate and electrically coupled to selected ones of the first plurality of contact pads. The package further includes a flexible circuitized substrate including a second plurality of contact pads, the flexible substrate being aligned relative to the rigid substrate such that selected ones of the second plurality of contact pads of the flexible substrate align with and engage respective ones of the first plurality of contact pads of the rigid substrate. The package even further includes third resilient means positioned in physical contact with the flexible circuitized substrate relative to the second plurality of contact pads in addition to a cover positioned on the base member. The cover is designed for exerting force on the third resilient means to cause the selected ones of the contact pads of the flexible circuitized substrate to exert a predetermined force onto the respective ones of the contact pads of the rigid circuitized substrate.

In accordance with another aspect of the invention, there is provided an electrical connector which is designed for providing effective electrical coupling between two pluralities of contact pads of two substrates. The connector comprises a base member defining a receiving area therein adapted for having the substantially rigid circuitized substrate positioned therein, the base member including first and second resilient means as part thereof The first resilient means is adapted for having the rigid circuitized substrate positioned thereon and the second resilient means is adapted for assisting in positioning the rigid circuitized substrate in predetermined alignment within the receiving area of the base member. The connector further includes means for aligning the flexible circuitized substrate relative to the rigid circuitized substrate such that selected ones of a first plurality of contact pads of the rigid circuitized substrate are aligned with selected ones of a second plurality of contact pads of the flexible circuitized substrate. In addition, the connector comprises a third resilient means adapted for being positioned in physical contact with the flexible circuitized substrate relative to the second plurality of contact pads, and cover means for being positioned on the base member and adapted for exerting force on the third resilient means when the second plurality of contact pads of the flexible circuitized substrate are positioned in the alignment with the first plurality of contact pads of the rigid circuitized substrate to thereby cause selected ones of the second plurality of contact pads to exert a predetermined force onto respective ones of the contact pads of the rigid substrate.

In accordance with yet another aspect of the invention, there is provided a flexible circuitized substrate which comprises a dielectric layer including first and second opposing surfaces, a plurality of contact pads located on the first surface of the dielectric layer, and a conductive layer located on the second surface of the dielectric layer substantially opposite the plurality of contact pads. The conductive layer is of a configuration for assuring enhanced flexibility of the flexible circuitized substrate in the region of the second plurality of conductive pads.

BEST MODE FOR CARRYING OUT THE INVENTION

For a better understanding of the invention, together with other objects, advantages and capabilities thereof, reference is made to the following disclosure in combination with the above-described drawings.

Figure 1:
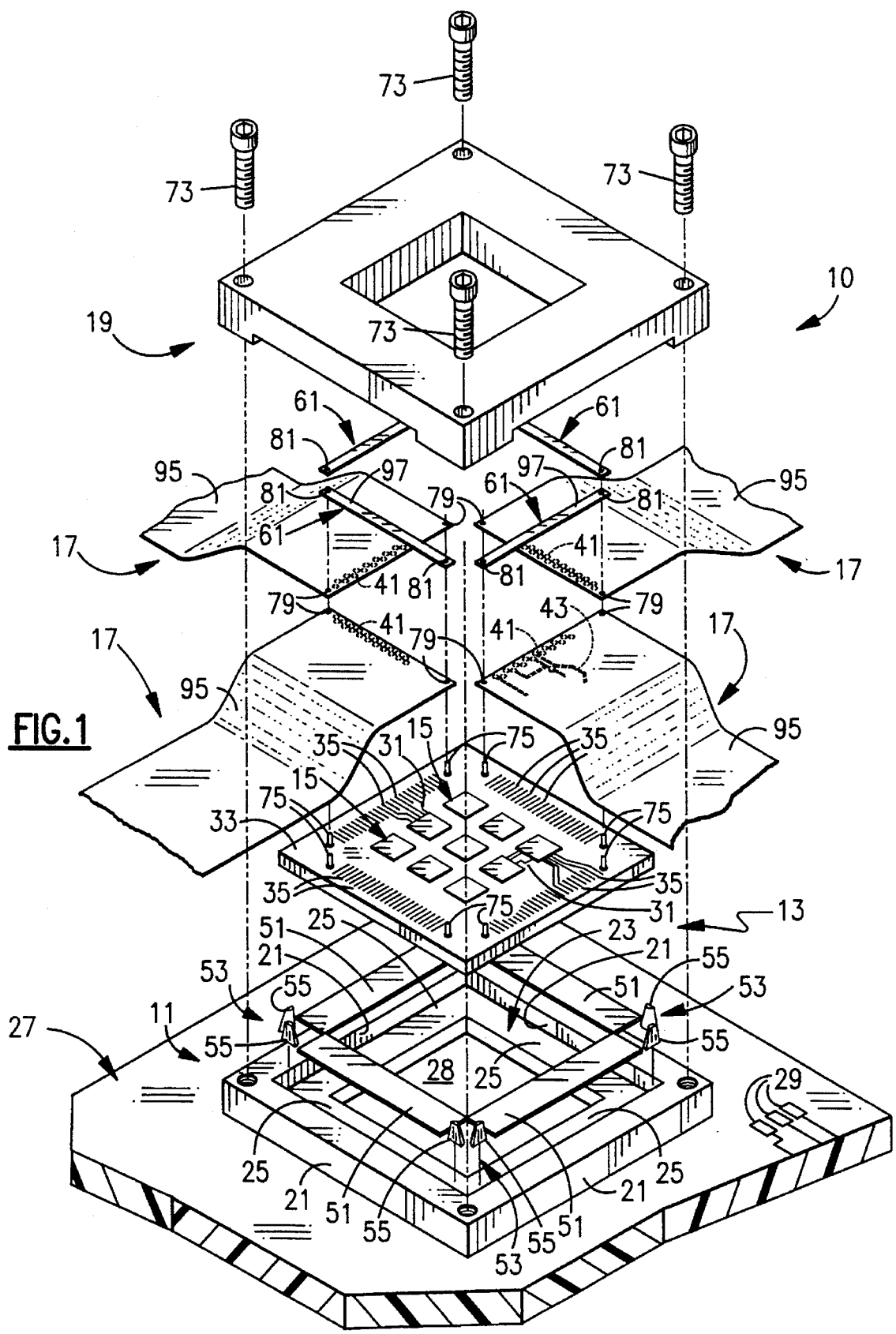
FIG. 1 is an exploded perspective view of an electronic package assembly in accordance with one embodiment of the invention.

In FIG. 1, there is shown an electronic package 10 in accordance with a preferred embodiment of the invention. Package 10 includes a base member 11, a substantially rigid circuitized substrate 13, at least one (and preferably several) semiconductor device(s) 15 located on substrate 13, at least one flexible circuitized substrate 17 for being positioned within package 10 and designed for being electrically coupled to the semiconductor device(s) 15, and a cover 19 which, as described, is adapted for being positioned on base member 11 to thus provide a cover for the various internal components of the invention while also serving to exert force in the manner defined herein so as to assure positive connection between the invention's circuitized substrates.

The electronic package as defined herein may also be referred to in the art as a multichip module (MCM) which, as is known, are specifically designed for having a plurality of semiconductor devices (chips) as electronic elements thereof. Such MCM's are known for use in information handling systems (computers) for processing specified information. It is known in the art to utilize a plurality of such electronic package assemblies within computers, the number of such assemblies often depending on the operational requirements of the computer.

It will be understood from the invention as defined herein that electronic package 10 represents a significant improvement to MCM components and similar electronic packaging structures. Such improvement is assured in at least one aspect of the invention through enhanced means for providing effective electrical connection between at least two circuitized substrates used therein. Other advantages, including for example the relative ease of assembly of the invention, as well as the reduced number of parts needed for same, are discernable from the teachings provided herein.

Base member 11, as shown in FIG. 1 is preferably of substantially rectangular configuration and includes four sides 21 which serve to define a central receiving area (opening) 23. Each side 21 includes a ledge portion 25, these ledges in turn defining a central opening 28 within the bottom of base member 11. Opening 28 enables electrical connection between substrate 13 and an external circuitized substrate, such as a printed circuit board 27, if desired. It is also within the scope of the invention to provide connection to the printed circuit board (PCB) using one or more of the flexible circuitized substrates 17 (e.g., by connecting conductors thereon to surface conductors (e.g., 29) on the PCB) or, even further, to simply not provide connection of any kind to PCB 27 but instead use package 10 to simply electrically couple only the plurality of chips 15 to the defined substrates 17. Substrates 17 could thereafter be adapted for being electrically coupled to associated external circuitry (e. g., another board, card or connector as may be utilized within the information handling system using the invention). The invention is thus not limited to electrically coupling of package 10 to PCB 27.

Receiving area 23 as defined by four sides 21 is thus of substantially rectangular configuration and suited for having the also rectangularly-shaped substrate 13 positioned therein. Substrate 13 is preferably of dielectric (e.g., ceramic) material and includes one or more layers of circuitry 31 as part thereof. In FIG. 1, circuitry 31 is shown located on the upper surface 33 of the substrate, this circuitry capable of being formed using known procedures (e. g., photolithography) in the art. As is further known, such ceramic substrates may include at least two such layers, separated by a dielectric layer (e.g., polyimide) to thereby provide a structure with increased capability. As seen in FIG. 1, each of the semiconductor chips 15 is positioned on surface 33 in a predetermined pattern and, as mentioned, electrically coupled to circuitry 31. Such electrical coupling, with respect to the present invention, is preferably accomplished using the aforementioned C4 solder process developed by the assignee of the present invention. Other means known in the art for coupling the chips to this circuitry are of course possible.

Significantly, substrate 13 further includes a plurality of contact pads 35 located in four longitudinal patterns along the respective peripheral portions of each of the four sides of the substrate. Each of these contact pads may be formed simultaneously with formation of circuitry 31 and thus using known techniques in the art. Such contact pads, as is circuitry 31, is preferably of copper material. In one embodiment of the invention, a total of 234 pads 35 may be provided for each linear inch of each longitudinal pattern as shown. In one example, each pattern may have a total length of about two inches, thus providing a total of 1,872 such pads on substrate 13.

Figure 3:
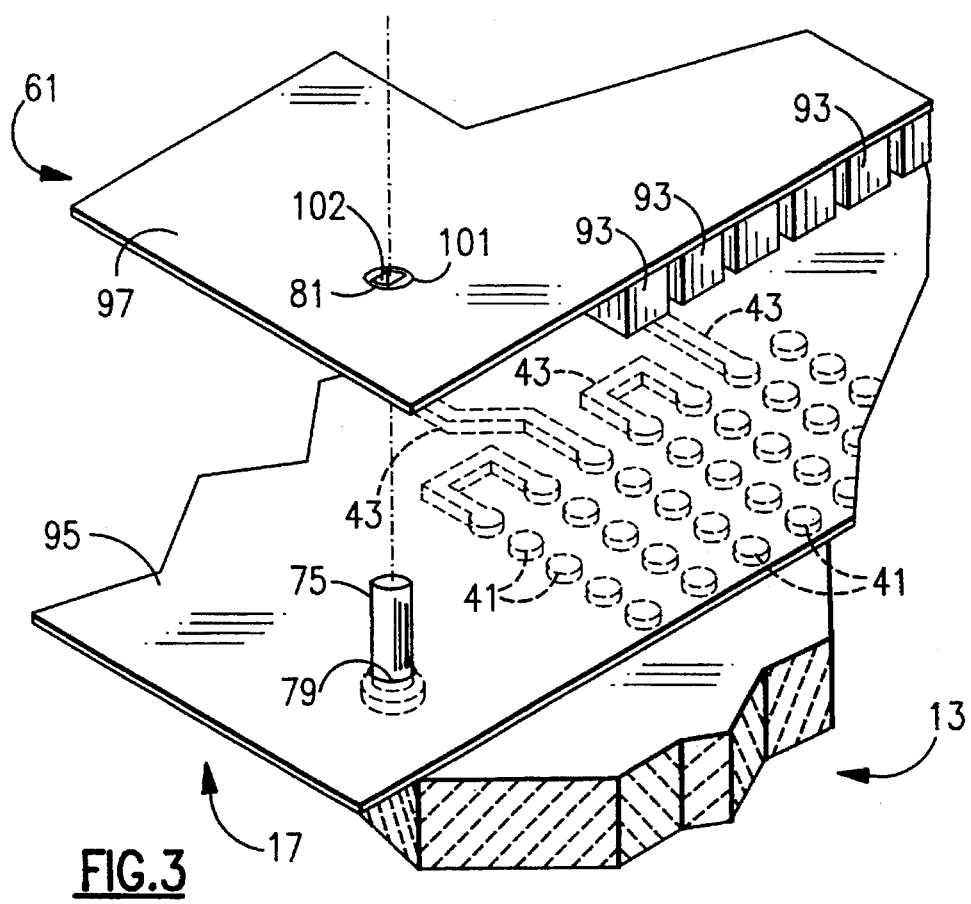
FIG. 3 is a partial view, on a much enlarged scale over the view in FIG. 1, illustrating a preferred example of an elastomeric retention feature of the invention.

In accordance with the teachings herein, selected ones of the pads 35 on substrate 13 are electrically connected to associated contact pads 41 (shown hidden in FIG. 1 and FIG. 3). Thus, each of the four flexible circuitized substrates 17 includes a pattern of individual pads 41 located on the undersurface of substrate 17 for engaging the associated pads 35 on the adjacent surface of substrate 13. Each of these pads may be formed in conjunction with formation of associated circuitry 43 (also hidden in FIGS. 1 and 3), this circuitry designed for connecting respective pads as desired and/or connecting each pad to an individual circuit line or the like which then extends outwardly from the pattern of pads 41 in accordance with the designed pattern. Only one layer of circuitry 43 and pattern of pads 41 is shown in FIG. 1 and it is understood that each of the circuitized substrates will include a pattern of such contact pads and associated circuitry. The pads 41 and circuitry 43 are preferably copper and formed in accordance with known techniques (e. g., photolithography) in the arts for forming flexible circuits. These conductive elements are formed on a layer of dielectric (e.g., polyimide) having a thickness, typically, of only from about 0.001 inch to about 0.002 inch. Each of the circuit lines are of a thickness of only about 0.00045 inch. Further, each of the pads 41 on substrate 17 is of a thickness of about 0.004 inch and include a slightly rounded (e.g., domed) contacting surface (not shown). Each pad 41, as shown, is also substantially cylindrical with a diameter of about 0.005 inch. In FIGS. 1 and 3, these pads are shown as being of substantially cylindrical configuration, but this is not meant to limit the invention and that other configurations (e.g., rectangular) are readily possible. It is also with the scope of the invention to provide more than one layer of pads and/or circuitry for each of the flexible circuitized substrates, again using formation techniques known in the art. Further description is thus not believed necessary.

Significantly, respective ones of the contact pads 35 on substrate 13 align precisely with and engage associated pads 41 on the respective flexible substrates to provide the desired connections for the present invention. In one example, the respective pads 35 and 41 are each located in a similar, rectangular pattern and spaced a distance apart from each other in each such rectangular pattern of from about 0.018 inch in one direction and 0.035 inch in the other direction. These are center-to-center spacings. Understandably, such high density patterns for these respective conductors mandates a highly precise means of both aligning the respective patterns as well as assuring effective pressure on the pads to effect a sound connection. It is understood from the teachings herein that the present invention provides for such alignment and connection in a new and unique manner, while assuring such capability within a compact, miniaturized structure. In FIG. 1, the semiconductor chips 15 are electrically coupled to selected ones of the contact pads 35 using the shown circuitry 31. Understandably, only portions of this circuitry 31 is shown in FIG. 1 for illustration purposes. It is understood, of course, that several patterns may be utilized and the invention is not limited to the representative patterns shown herein.

In order to properly align the rigid, ceramic substrate 13 in base member 11 in a manner to protect the substrate and properly cushion this member against possible breakage while maintaining a precise, centering thereof within receiving area 23, base member 11 includes first and second resilient structures 51 and 53 respectively (only three sets of structures 53 are shown, it being understood a fourth is hidden under substrate 13). Each of the first resilient structures 51 comprises an elongated, flat elastomeric member of substantially rectangular configuration designed for having a respective one of the outer edge portions of substrate 13 seated thereon. Each elastomeric pad 51 rests on a respective ledge 25 formed along a respective one of the sides 21 of member 11. In one example, each pad possessed a width of 0.250 inch, a length of 1.850 inch and corresponding thickness of only about 0.020 inch. The preferred elastomeric material for these pads 51 is silicone rubber. Thus, it is seen that the ceramic substrate 13 is positively seated on at least four elastomeric members so as to assure positive seating of the substrate within base 11 while also preventing breakage or other damage thereto.

Figure 2:
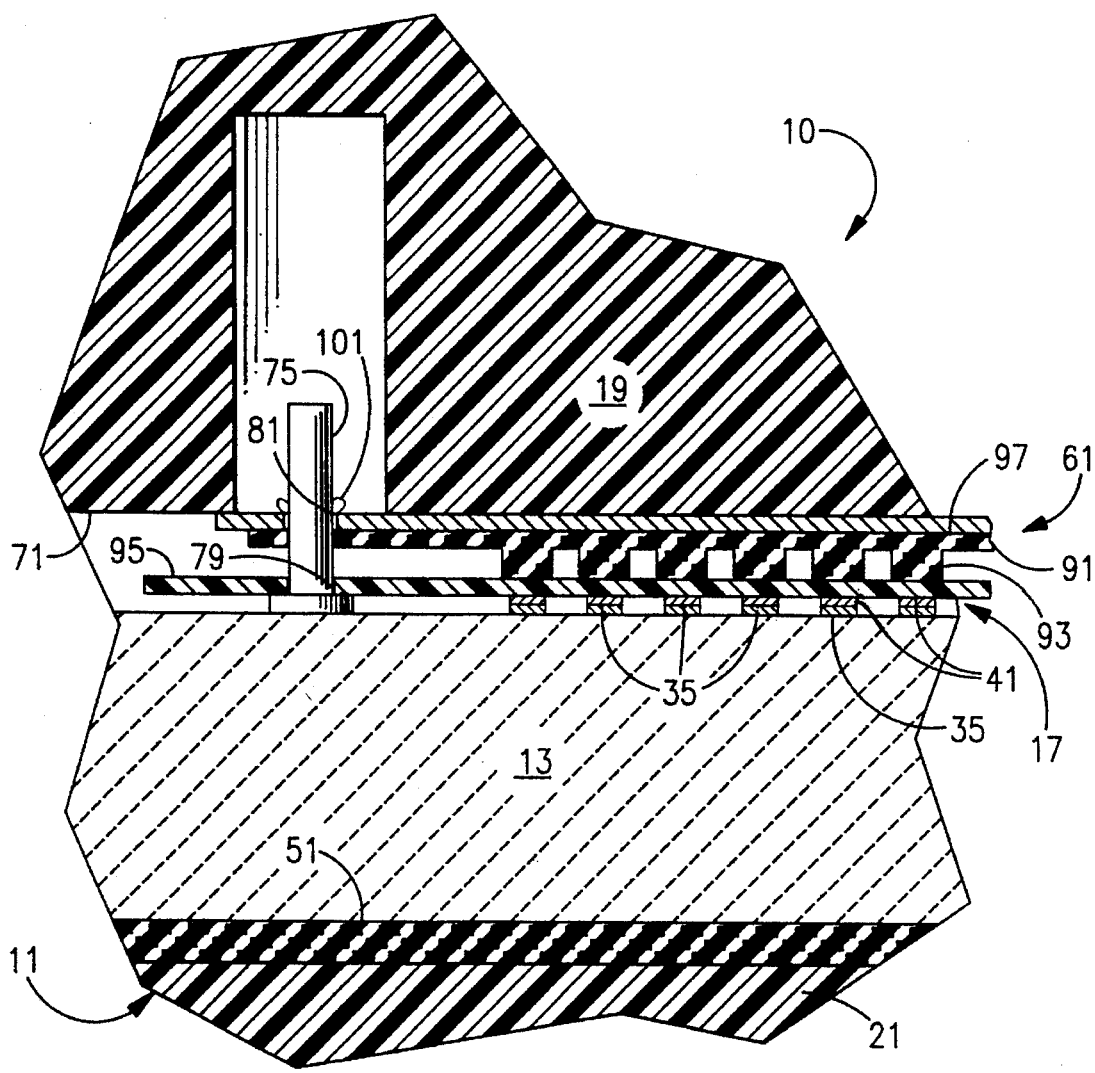
FIG. 2 is a partial, side elevational view of the FIG. 1 assembly, in section and on a much enlarged scale over the view in FIG. 1.
Figure 2A:
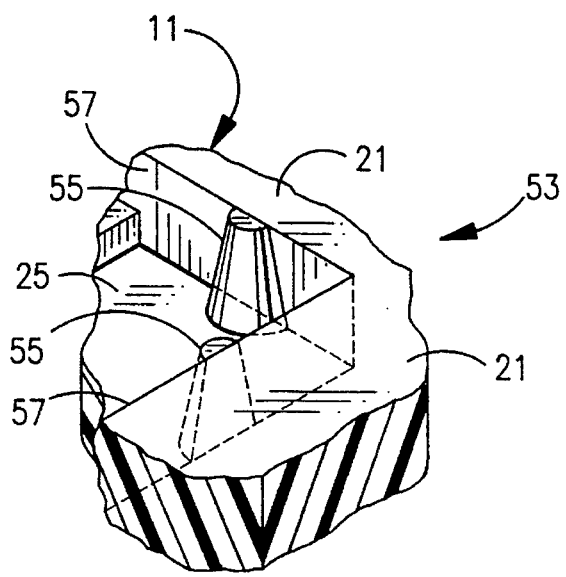
FIG. 2A is a much enlarged, partial view of a preferred embodiment of a second resilient means for use in the invention.

In order to assure effective and required centralized alignment of the substrate 13 (e.g., to align respective pads thereof with associated conductors on PCB 27, if such a connection is desired), base member 11 further includes the mentioned second resilient structures 53. In a preferred embodiment, these second resilient structures 53 each comprise a pair of tapered elastomeric members 55 (see particularly FIG. 2A) located within respective corners of the rectangular base 11. As shown in FIG. 2A, each elastomeric member abuts a respective internal wall 57 of a respective side 21 and, as shown, is tapered from a narrower upper portion to a larger lower portion (adjacent or positioned on ledge 25). Thus, the rectangular ceramic substrate 13 rests downwardly on these tapered elastomeric members 55 and reaches a predetermined depth within receiving area 23, depending on the respective dimensions of the tapered elastomerics and corresponding outer dimensions of the rectangular substrate. In one example, each elastomeric member 55 is comprised of silicone rubber and may include an overall height of only about 0.235 inch with upper and lower widths of about 0.187 inch and about 0.250 inch respectively.

As seen in FIG. 1, package 10 further includes resilient structures 61 which, as shown, are designed for being aligned relative to a respective one of the flexible substrates 17 and, significantly, for exerting pressure onto the respective flexible substrates when package 10 is fully assembled. These resilient structures 61, also seen in FIG. 2, are designed for being engaged by an undersurface 71 (FIG. 2) of cover 19 when the cover is assembled and secured to base 11 (e.g., using screws 73). Most significantly, each of the elastomeric structures 61 are particularly designed for being precisely aligned relative to the respective flexible circuitized substrates, which substrates in turn are critically aligned with the respective circuitized substrate 13 so as to assure precise alignment between the pads 35 and 41. Such alignment, as seen in FIGS. 1, 2 and 3, is attained, preferably, using a plurality of upstanding pins 75, two of these pins aligning precisely with a respective pattern of contact pads 35 located therebetween. Thus, two such pins are used for each pattern of pads. Each designated pair of pins 75 is designed for being frictionally positioned within a respective aperture 79 formed within the forward edge portions of each flexible circuitized substrate 17 relative to the associated pattern of conductors 41 for each substrate. Each of the illustrated apertures 79 may be formed simultaneously with the formation of circuitry 43 and pads 41 using precise photolithography techniques, following which these apertures may then be formed, e.g., using drilling, etching or the like. Alternatively, it is possible to precisely punch such apertures at designated locations from the respective patterns, e.g., using optical alignment.

In a preferred embodiment, each of the upstanding pins 75 is precisely orientated relative to the respective adjacent pattern of pads 35 using precise camera techniques. That is, cameras are used to effectively align and position the pins in the precise orientation desired, the pins then being secured (e.g., using suitable adhesive) in place. Pins 75 are preferably metallic, e.g. stainless steel. The use of pins 75 is deemed important to provide a means whereby each of the flexible circuitized substrates can be initially, yet precisely, positioned on the respective substrate 13 in alignment with respective pads 35 prior to final assembly of package 10. Such preassembly is, as understood, considered essential in the present invention prior to positioning of the respective resilient structures 61 and, finally, cover 19. With the flexible substrates in initial contact and aligned contact position (e.g., as shown in FIG. 2), the resilient structures 61, each including paired apertures 81 therein, are then positioned on pins 75 in the manner shown in FIG. 2. (In FIG. 1, it is understood that the two resilient structures 61 shown partially under cover 19 include apertures 81 in the respective ends thereof, and are of a similar configuration as the two structures fully illustrated.

Each of the elastomeric structures 61 preferably includes a stepped elastomeric member (e.g., of silicone rubber) including a base layer 91 and a plurality of upstanding portions 93, each of the portions 93 designed for aligning with a respective one of the contact pads 41, and thus pads 35 on the opposite surface of the dielectric (e.g., polyimide) layer 95 which forms part of the circuitized substrate 17. This arrangement is better seen in FIG. 2.

As mentioned above, the use of a stepped elastomeric is defined in U.S. Pat. No. 4,902,234, which is incorporated herein by reference. This elastomeric is secured (e.g., vulcanized) to a substantially rigid backing plate 97 which forms the other part of each resilient elastomeric structure 61. The preferred backing plate 97 is metallic, preferably of stainless steel or aluminum material. In one example, the backing plate possesses of a thickness of about 0.005 inch, with the attached elastomeric having a total thickness of about 0.020 inch. Each of the upstanding portions 93 project a distance of 0.015 inch from the respective base portion 91.

In FIG. 2, cover 19 is shown in position to compress the respective resilient structures 61 against the previously positioned circuitized substrate 17, this substrate 17 in turn precisely aligned with and positioned on the rigid circuitized substrate 13 such that the respective pads 35 and 41 are in positive contact. Accordingly, the pads of the flexible circuitized substrate 17 exert a predetermined force on respective pads of substrate 13. In a preferred embodiment, this force per pad is within the range from about 60 to about 80 grams. A preferred material for cover 19 and base 11 is metal, two examples being aluminum and stainless steel. Alternatively, these members can be of a plastic material, and preferably a thermoset plastic.

In FIG. 3, it is shown that the resilient structure 61, including the backing plate 97 and attached elastomeric (upstanding portions 93 shown) includes within opening 81 means for assuring that the respective pin 75 will be frictionally retained therein. In a preferred embodiment, such frictional retention is preferably accomplished using a quantity of elastomeric material 101 seated within opening 81 and having an aperture 102 with an internal dimension slightly less than the corresponding outer dimension of corresponding pin 75. This elastomeric, preferably of silicone rubber, is also seen in FIG. 2 as being partly removed from the respective opening 81 during full pin insertion. Significantly, resilient structure 61 is thus retained in precise orientation prior to subsequent engagement by cover 19 such that the illustrated elastomeric projecting portions 93 are in turn precisely aligned with the respective pads (41) located on the undersurface of the dielectric layer 95. Such initial frictional retention of the resilient structures 61 is accomplished in a relatively precise manner using the defined elastomeric and associated projecting pins to thereby uniquely permit positioning of these resilient structures prior to cover attachment. This arrangement thus facilitates assembly of the invention while assuring precisioned alignment and retention of the various elements therein.

Figure 6:
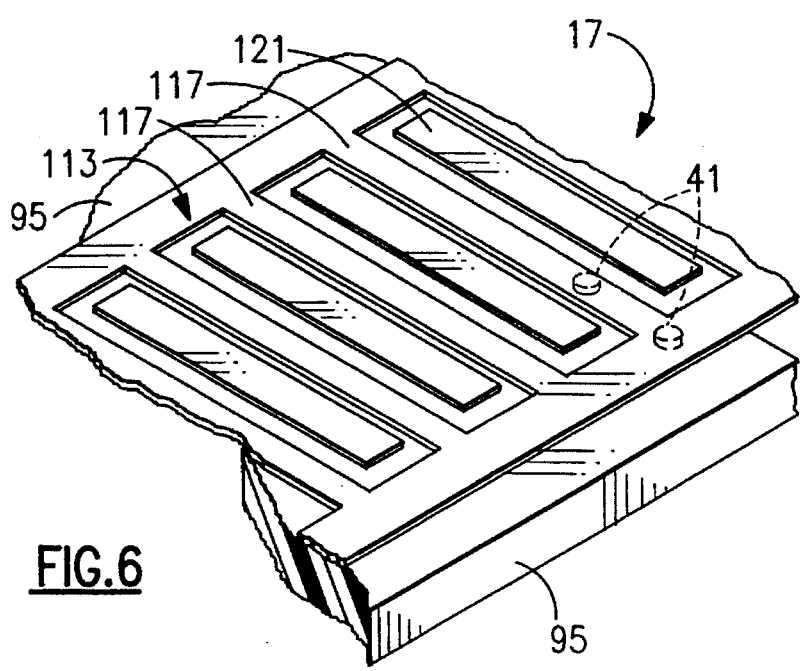
FIGS. 4–6 illustrate three different versions of enhanced flexibility portions of a flexible circuitized substrate in accordance with preferred embodiments of the invention.
Figure 4:
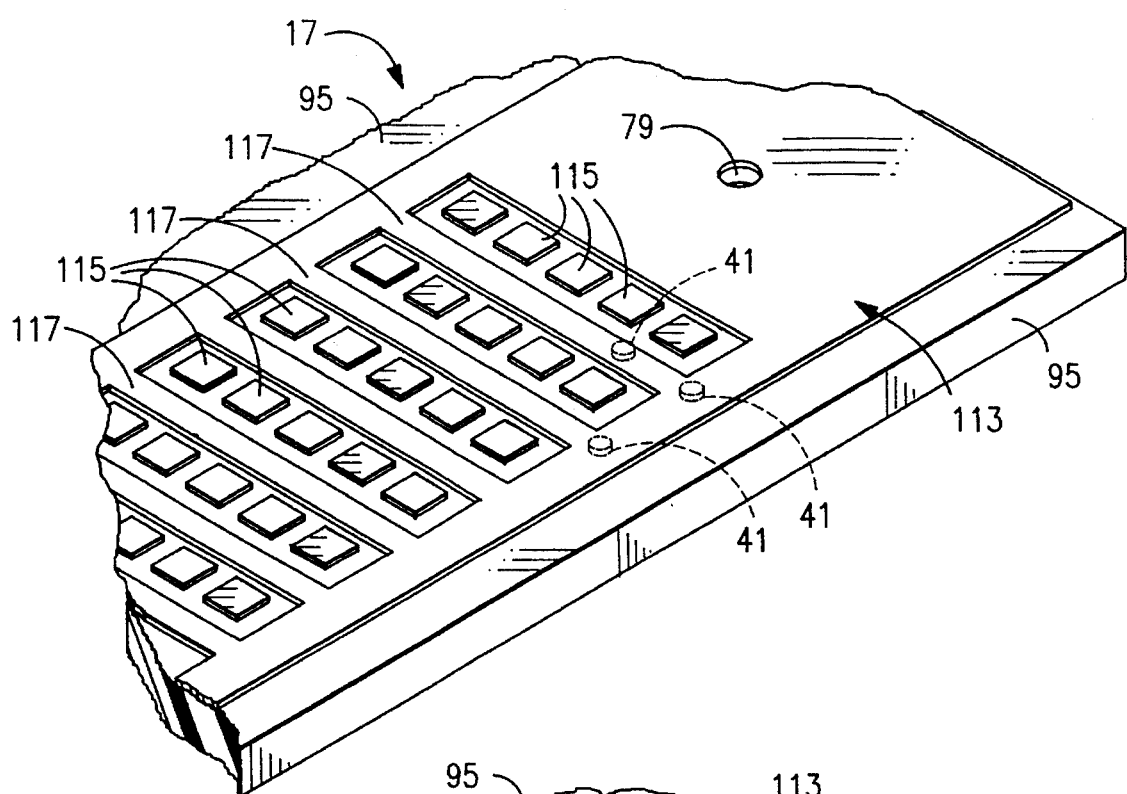
Figure 5:
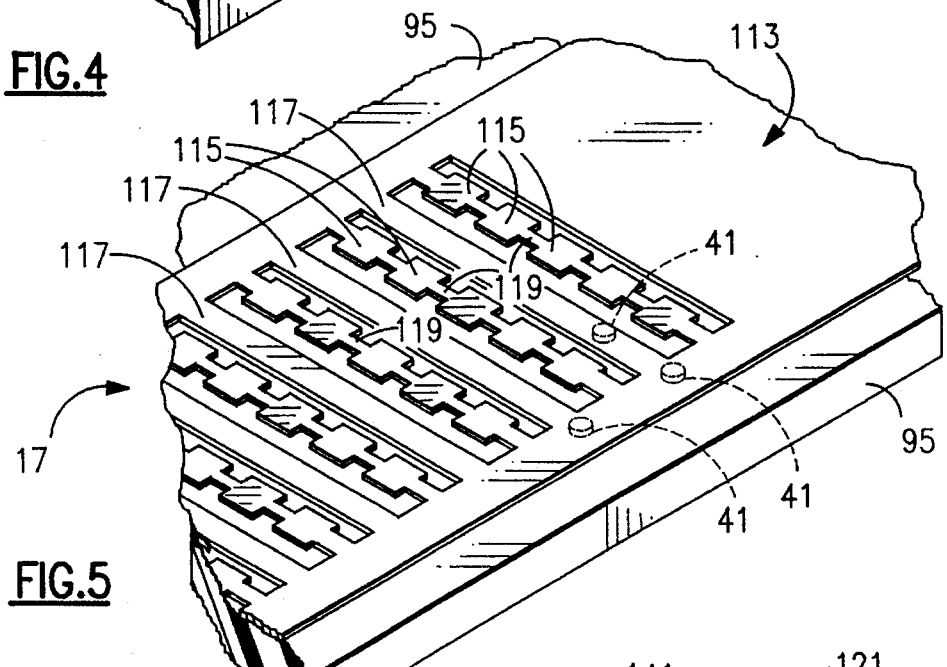

In FIGS. 4–6 there are shown various structures for the flexible circuitized substrates of the invention to assure enhanced flexibility of these substrates in the region of the associated pads 41 (only a few shown in FIGS. 4–6 for illustration purposes). Enhanced flexibility (resilience) of these portions of each of the respective flexible circuitized substrates is highly desired to assure the aforementioned precise alignment of this portion of the substrates within package 10 (relative to the associated pads 35 on substrate 13.

In FIGS. 4–6, this enhanced flexibility is provided using a conductive layer 113 formed on an opposite surface of the polyimide dielectric layer 95 from the respective contact pads 41. In the embodiment of FIG. 4, a plurality of contact pads 115 are provided each preferably opposite a respective contact pad 41. Additionally, separating these linear arrays of such contact pads 115 is an elongated, interim pad 117. Pads 115 and 117, and the remainder of conductive layer 113, are preferably comprised of copper and may be formed on the undersurface of dielectric layer 95 using known techniques (e.g., photolithography). In one example, the conductive layer 113 possessed a thickness of only about 0.0004 inch. Understandably, this layer can also provide an electrical capability, e.g., ground, as part of the circuit for substrate 17, if desired. Layer 113 may also function as a shield to prevent electrical noise from adversely affecting circuitry 43 performance, and may even further assist in providing controlled impedance for the flexible substrate.

In the embodiment of FIG. 5, each of the pads 115 is shown as being connected in one longitudinal pattern by a longitudinal pad 119 which, as shown, extends across the linear pattern. In both FIGS. 4 and 5, the interim conductive pads 117 extend outwardly and form part of the overall larger conductive portion of layer 113. In the embodiment of FIG. 5, the coupled patterns of pads 115 are also extended, using the longitudinal pads 119, to also be coupled and form part of the larger, common portion of the conductive layer 113.

In FIG. 6, an alternative embodiment for enhanced flexibility for the flexible circuitized substrate is shown. In this embodiment, a singular, elongated pad 121 is utilized to align with a respective number of individual pads 41 on the opposite side of dielectric layer 95. Each of these elongated pads 121 is separated by the interim longitudinal pad 117 much the same as in FIGS. 4 and 5. In one embodiment of the invention, each of the elongated pads 121 may possess a length of about 0.1643 inch and corresponding width of 0.015 inch. Each of the pads 115 is, as shown, rectangular with length and width dimensions of 0.015 inch and 0.015 inch, respectively. Each pad 119 has a width of only about 0.005 inch.

As seen in FIGS. 4–6, the enhanced flexibility for the invention's flexible substrate is only provided at the forward edge portions (that above the respective pattern of contact pads 41). This is not meant to limit the invention, however, in that such enhanced flexibility may be extended throughout other portions, including the remainder, of the flexible circuitized substrate.

Figure 7:
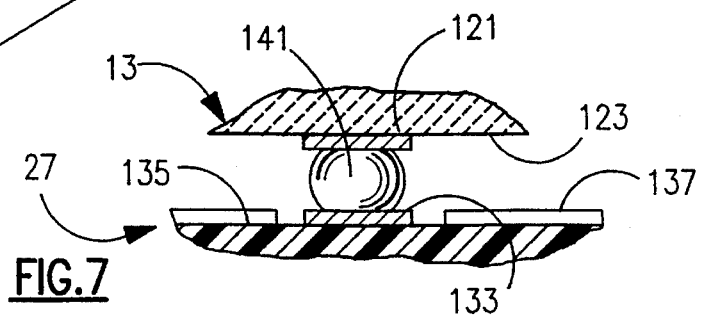
FIG. 7 is a partial side elevational view, in section, illustrating the rigid circuitized substrate of the invention being electrically coupled to another circuitized substrate (e.g., a printed circuit board).

In FIG. 7, it is seen that substrate 13 can be directly electrically connected to PCB 27, to thus add to the capabilities of the present invention, e.g., provide a source of power to substrate 13. If such connection is desired, the ceramic substrate 13 may include a plurality of contact pads 121 (only one shown in FIG. 7) located along the bottom surface 123 thereof, each of these pads 121 designed for aligning with a respective conductive pad 133 on the PCB's upper surface 135. Remaining portions of part of the electrical circuitry 137 of PCB 27 are also seen in FIG. 7. In one embodiment, these pads are joined using a solder 141, one example of such a solder being 63:37 tin: lead solder, several kinds of which are known in the art. Alternative solder techniques and other means (e.g., using dendritic structures as defined in Canadian Pat. 1,121,011) may also be used. Use of dendritic structures (e.g., palladium growth crystalline structures) may also be utilized to provide enhanced connections between pads 35 and 41 in the invention. As stated, such structures are fully defined in the aforementioned Canadian patent as well as in other patents assigned to the assignee of the present invention. Two examples of such patents include U.S. Pat. No. 5,137,461 (P.S. Bindra et al.) and U.S. Pat. No. 5,185,073 (P.S. Bindra et al.), both of which are incorporated herein by reference, in addition to the aforementioned Canadian patent. The use of dendritic contact structures is desired in the art to provide enhanced connections, as these structures possess the ability to penetrate contaminants and other undesirable elements (e. g., fibers) which may accumulate on contact pads such as those shown herein. Further description of such structures is thus not believed necessary. It is also possible to use pins and corresponding socket members for this connection, the pins preferably projecting from the underside of substrate 13.

There has thus been shown and described an electronic package assembly which provides for enhanced coupling and alignment of the highly precise circuitized structures used therein. Such alignment and connection is made possible through the use of various resilient members strategically positioned within the invention to act in a cooperative manner relative to one another and thus assure effective force application, positioning and protection for the final structure. There has also been shown a connector for use with circuitized structures of the type taught herein, in addition to a flexible circuitized substrate which is particularly adapted for use in such a structure, this flexible substrate including enhanced flexibility thereof to thus facilitate alignment and engagement of the substrate within such an assembly.

While there have been shown and described what are at present considered the preferred embodiments of the invention, it will be obvious to those skilled in the art that various changes and modifications may be made therein without departing from the scope of the invention as defined by the appended claims.

What is claimed is:

1. A flexible circuitized substrate comprising:

a dielectric layer including first and second opposing surfaces;

a plurality of contact pads spacedly located on said first surface of said dielectric layer; and a conductive layer located on said second surface of said dielectric layer substantially opposite said plurality of contact pads, said conductive layer comprising a plurality of spaced pads located on said dielectric layer substantially opposite selected ones of said plurality of contact pads, and an interim elongated pad located on said dielectric layer between selected ones of said spaced pads and separating said selected ones of said spaced pads, said conductive layer being of a configuration for assuring enhanced flexibility of said flexible circuitized substrate in the region of said plurality of contact pads.

2. The flexible circuitized substrate of claim 1 further including at least two longitudinal pads, each of said longitudinal pads interconnecting selected ones of said spaced pads to define at least two interconnecting rows of said spaced pads.

3. The flexible circuitized substrate of claim 1 wherein said dielectric layer is comprised of polyimide.

4. The flexible circuitized substrate of claim 1 wherein said contact pads and said conductive layer are comprised of copper.

5. A flexible circuitized substrate comprising:

a dielectric layer including first and second opposing surfaces;

a plurality of contact pads spacedly located on said first surface of said dielectric layer; and a conductive layer located on said second surface of said dielectric layer substantially opposite said plurality of contact pads, said conductive layer including at least two elongated spaced pads and an interim elongated pad separating said elongated spaced pads, each of said elongated spaced pads aligning with selected ones of said contact pads, said conductive layer being of a configuration for assuring enhanced flexibility of said flexible circuitized substrate in the region of said plurality of contact pads.

6. The flexible circuitized substrate of claim 5 wherein said dielectric layer is comprised of polyimide.

7. The flexible circuitized substrate of claim 5 wherein said contact pads and said conductive layer are comprised of copper.

\* \* \* \* \*